United States Patent [19]
Russell et al.

[11] Patent Number: 6,140,812
[45] Date of Patent: Oct. 31, 2000

[54] ELECTRONIC INSTRUMENT WITH MULTIPLE POSITION SPRING DETENTED HANDLE

[75] Inventors: Brian G. Russell, Tigard; Preston S. Gabel, Hillsboro; William R. Pooley, Aloha, all of Oreg.

[73] Assignee: Tektronix, Inc., Beaverton, Oreg.

[21] Appl. No.: 09/100,788

[22] Filed: Jun. 18, 1998

[51] Int. Cl.[7] .................................................. G01R 1/04
[52] U.S. Cl. ........................... 324/156; 220/756; 220/764
[58] Field of Search .......................... 324/156; 16/114 R, 16/110 R, 121; 7/167; 294/167–169; 220/756, 762, 763–766, 4.02

[56] References Cited

U.S. PATENT DOCUMENTS 3,813,004  5/1974  Andreaggi ................................. 220/756
3,924,775  12/1975  Andreaggi et al. ....................... 220/96

*Primary Examiner*—Jay Patidar
*Attorney, Agent, or Firm*—Bennet K. Langlotz; Thomas F. Lenihan

[57] ABSTRACT

An electronic instrument includes a housing having opposed end surfaces each including a handle mount. A bail handle with an elongated middle portion has extending arms connected at opposite ends, and the arms have free ends for connection at the handle mounts. The handle pivots between a first stable position and a second stable position about a pivot axis passing through the handle mounts. A pair of detent mechanisms each have a first portion connected to the housing, and a second portion connected to the handle, and each detent mechanism includes a spring which urges the first and second portions toward each other along the pivot axis.

13 Claims, 4 Drawing Sheets

ELECTRONIC INSTRUMENT WITH MULTIPLE POSITION SPRING DETENTED HANDLE

FIELD OF THE INVENTION

The invention relates to electrical instruments, and more particularly to portable instruments requiring multiple orientations for use.

BACKGROUND AND SUMMARY OF THE INVENTION

Portable electronic instruments such as oscilloscopes are often required to be portable for testing devices at various locations. Accordingly, they are typically provided with carrying handles. The handle is typically a bail handle pivotally mounted to opposite side panels at positions near the front panel. The handle has arms that extend parallel to the side panels, with a cross member connecting the handle ends.

The handle may be moved among several positions, and has locking mechanisms at each pivot mount to secure the handle in any of several possible positions. When transporting the instrument, the handle is positioned with its arms extending perpendicular to the front panel, and the handle cross portion bisecting the front panel. A conventional oscilloscope handle may be positioned below the plane of the bottom panel to elevate the front panel and angle it somewhat upward from a vertical position. While the rear edge of the instrument rests on a bench surface, the front edge elevation and angle may be selected based on the angle of the handle below the plane of the instrument housing.

Typically, locking mechanisms for existing instrument handles employ a series of pins and holes located about the pivot axis. With the pins on one part, and the holes on the other, the user must use both hands to grasp each handle hub, pull the handle ends axially away from the housing hubs to disengage the pins from the holes, then synchronously pivot the handle to the desired position until the pins engage the holes on both sides. This is an awkward process that requires both hands. Sometimes, particularly with the lightweight and slim handles that are otherwise desirable, the locking mechanisms become locked in non parallel positions, so that the handle is torsionally distorted. This may bind the hubs, or cause damage to the locking mechanisms.

The embodiments disclosed herein overcome these limitations by providing an electronic instrument with a housing having opposed end surfaces each including a handle mount. A bail handle with an elongated middle portion has extending arms connected at opposite ends, and the arms have free ends connected to the handle mounts. The handle pivots between a first stable position and a second stable position about a pivot axis passing through the handle mounts. A pair of detent mechanisms each have a first portion connected to the housing, and a second portion connected to the handle, and each detent mechanism includes a spring.

DETAILED DESCRIPTION OF A PREFERRED EMBODIMENT

Figure 1:
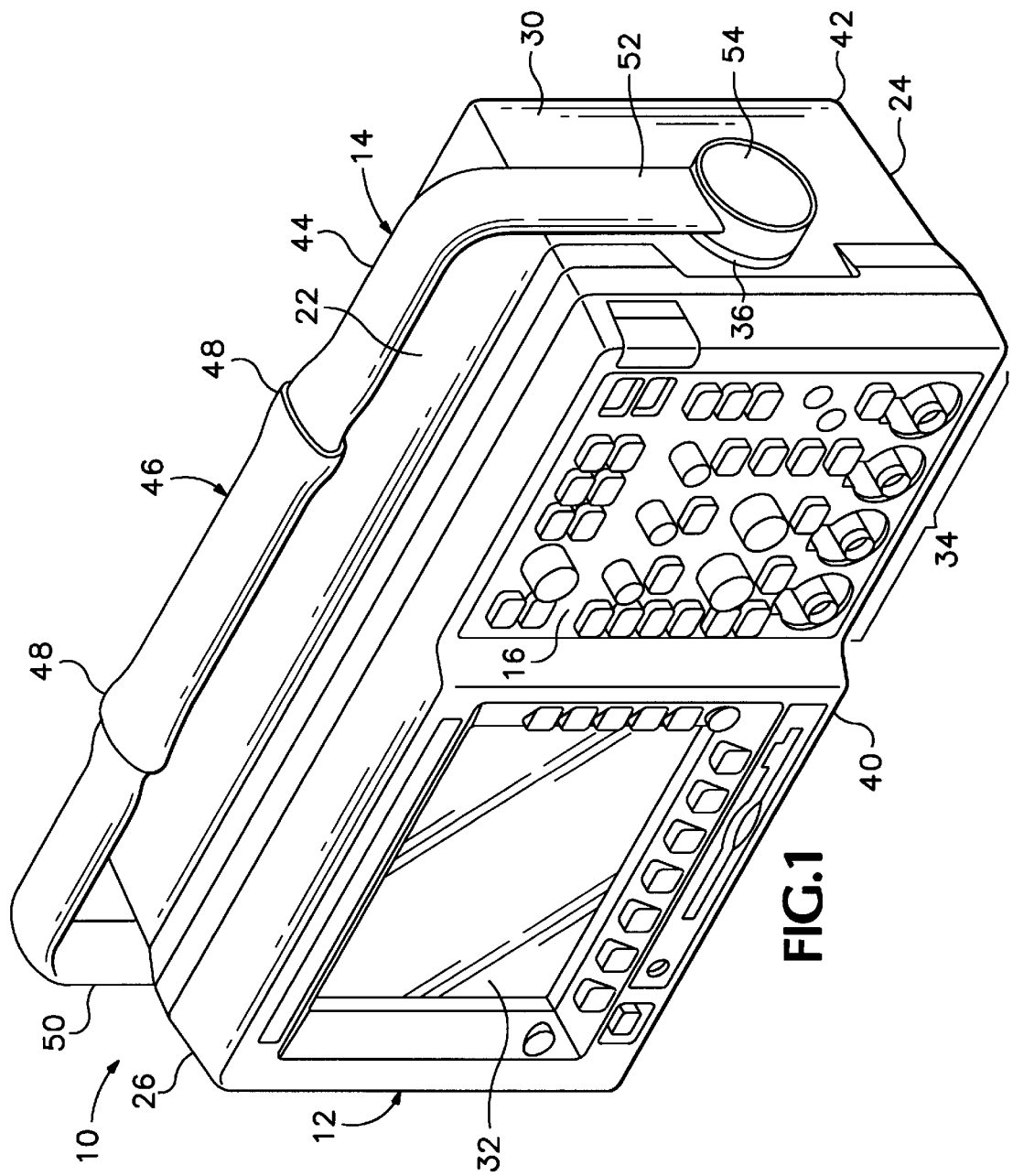
FIG. 1 is a perspective view of an instrument according to a preferred embodiment of the invention.

FIG. 1 shows a compact portable oscilloscope 10 having a housing 12 and a movable bail handle 14. The housing has a generally orthogonal box-like shape, with a front surface 16, a rear surface 20, top surface 22, bottom surface 24, and left and right side or end surfaces 26 and 30. A display screen 32 and interface panel 34 having numerous controls and lead connectors occupy the front panel. The side panels each have a central pivot boss 36 to support the handle 14.

The display screen 32 is a flat panel display having minimal intrusion into the chamber defined by the housing, permitting the housing to have a limited depth less than or comparable to the housing's height, and substantially less than the width of the housing. In the preferred embodiment, the housing has a width of 13", a depth of 6", and a height of 7". The generally box-like shape provides the bottom panel with a front edge 40 where it intersects the front panel 16, and a rear edge 42 where it intersects the rear panel 20. In the carrying position shown, with the bottom panel horizontal, and the handle in a vertically upward extending position, the front and rear edges provide some stability when the bottom panel rests directly on a flat surface.

The handle 14 is a hollow, rigid plastic elongated member having an oval cross section for torsional rigidity. The handle has an elongated cross member 44 extending the width of the housing and having a centrally located hand grip 46. The grip 46 has a resilient elastomeric surface that resists sliding on smooth surfaces when used as a support leg, and has an elongated central portion terminated by a pair of enlarged lobes 48 that are widely spaced apart by at least about one third the length of the handle. As will be discussed below, the spaced apart lobes provide two distinct points of contact when the handle is used as a support. The substantial spacing of the lobes will provide lateral stability in these instances.

A pair of arms 50, 52 extends perpendicularly from each end of the cross member to provide a bail shape. A pivot mechanism 54 is connected to the free end of each arm. Each pivot mechanism is connected to a respective boss 36 on the housing, and includes a limiter that prevents the handle from pivoting beyond a selected range of motion. The pivot mechanism also includes a stop, lock or detent mechanism, so that the handle is made stable in several selected different angular positions, as will be discussed below. In each of the stable positions, the handle resists movement in response to a limited force below a selected threshold, so that the weight of the instrument or forces associated with operation do not move the handle. A deliberate force, such as to unlock a stop, or to overcome a resistance are required to move the handle. The pivot, limit, and stop mechanisms may include components mounted on the arm and on the housing to operate in concert.

Figure 2:
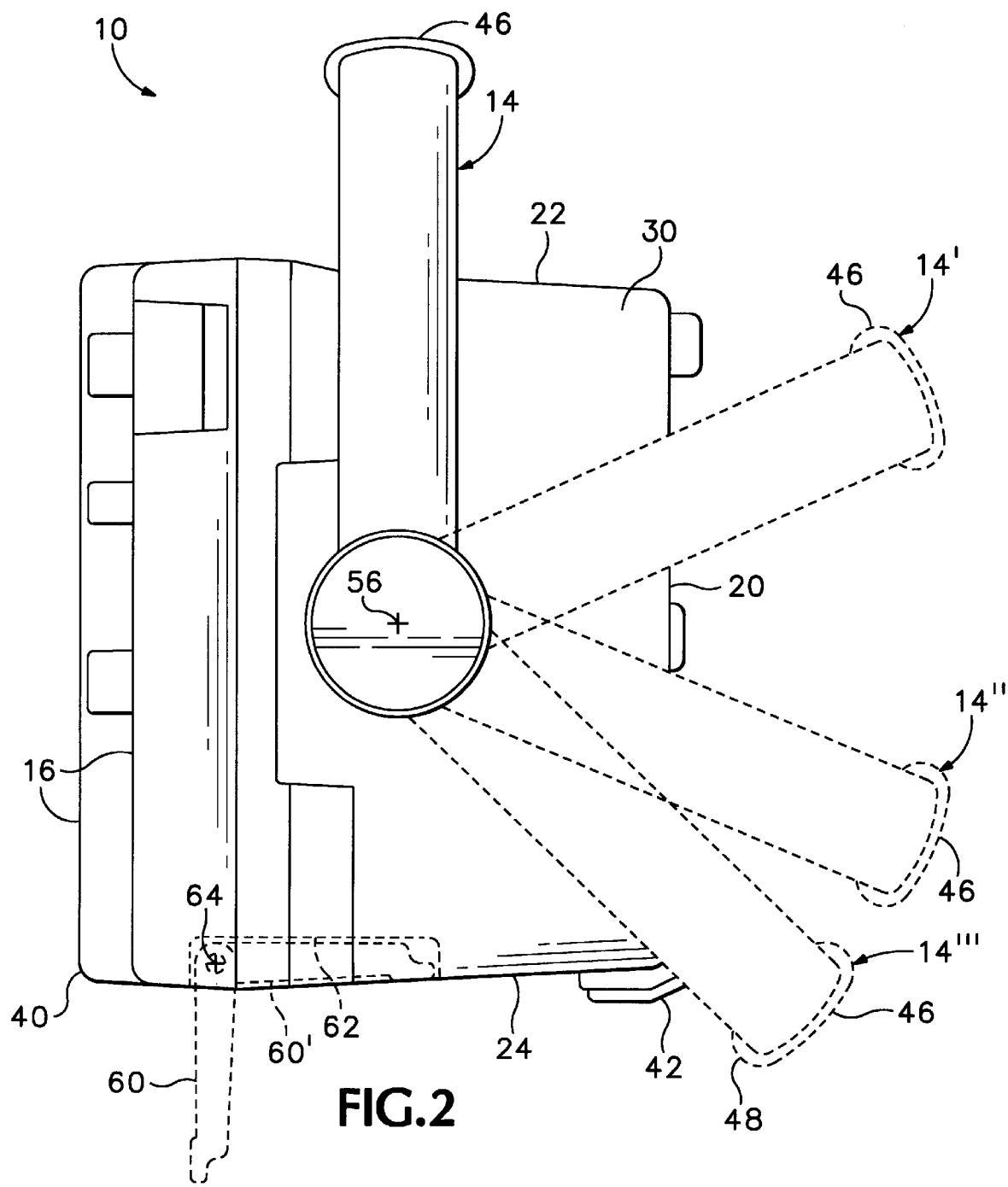
FIG. 2 is an end view of the instrument of FIG. 1 having a handle in a first position and the instrument in a first orientation.

FIG. 2 shows an end view of the instrument with several alternative handle positions in dashed lines. Handle 14 is shown in solid lines in the carrying position, extending vertically upward from a handle pivot axis 56 when the instrument is oriented upright for carrying or for placement of its bottom panel on a horizontal surface. In the carrying position, the handle extends parallel to the front surface of the housing, and is in its maximum forward position (maximum counter-clockwise rotation in the view shown) as limited by the limit mechanism.

As shown in dashed lines, the handle may be pivoted to several different stabilizing positions offset from the carrying position by different amounts. Each stabilizing position is intended for stably orienting the instrument in a different orientation, typically on a horizontal surface, with different orientations being useful for different viewing angles and different surface heights relative to the viewer. A first stabilizing position 14' is offset 65° from the carrying position in the rearward and downward direction (clockwise in the illustration). Because this is an acute angular displacement, the first handle position 14' is above the horizontal, and the handle grip 46 is above the pivot axis 56 which approximates the center of mass of the instrument.

A second stabilizing position 14" is offset 113° from the carrying position in the rearward and downward direction (clockwise in the illustration). This obtuse angular displacement provides a substantial rearward extension behind the rear panel, with adequate proximity to the plane of the bottom panel as will be discussed below.

A third stabilizing position 14''' is offset 134° from the carrying position in the rearward and downward direction (clockwise in the illustration). This greater obtuse angular displacement provides some rearward extension behind the rear panel, with a portion of the lobes 48 of the handle grip 46 extending below the plane of the bottom panel.

The housing also includes a pair of props 60, which are foldable legs that extend below the bottom panel when in an extended position, and which stow in bottom panel recesses 62 when in a recessed position 60'. The props are positioned near the front housing edge 40 for elevating the front panel and tilting the housing backward for viewing. The props are widely spaced apart near the end panels to provide lateral stability. The prop pivot axis 64 is located at the forward end of the stowed prop, so that the prop unfolds forward as it extends. This make the extended prop stable against forces applied to the front panel such as while pressing buttons.

The instrument may be placed in several different positions on a horizontal work surface, by varying the handle and prop positions. With the handle in the carrying position 14, the instrument may be placed with its base flat on the surface. With the props extended, the instrument may be tilted back with a viewing angle of 22 degrees from the horizontal. With the handle in the first stabilizing position 14', the instrument may be tilted back to rest on the handle and the rear base edge for an upward facing viewing angle of 66 degrees above the horizontal. With the handle in the second stabilizing position 14", and the props extended, the instrument has a broad base, resting on the props and the handle for a 22 degree viewing angle. With the props extended and the handle in the third stabilizing position 14''', the instrument is slightly elevated for a 12 degree viewing angle.

Figure 3:
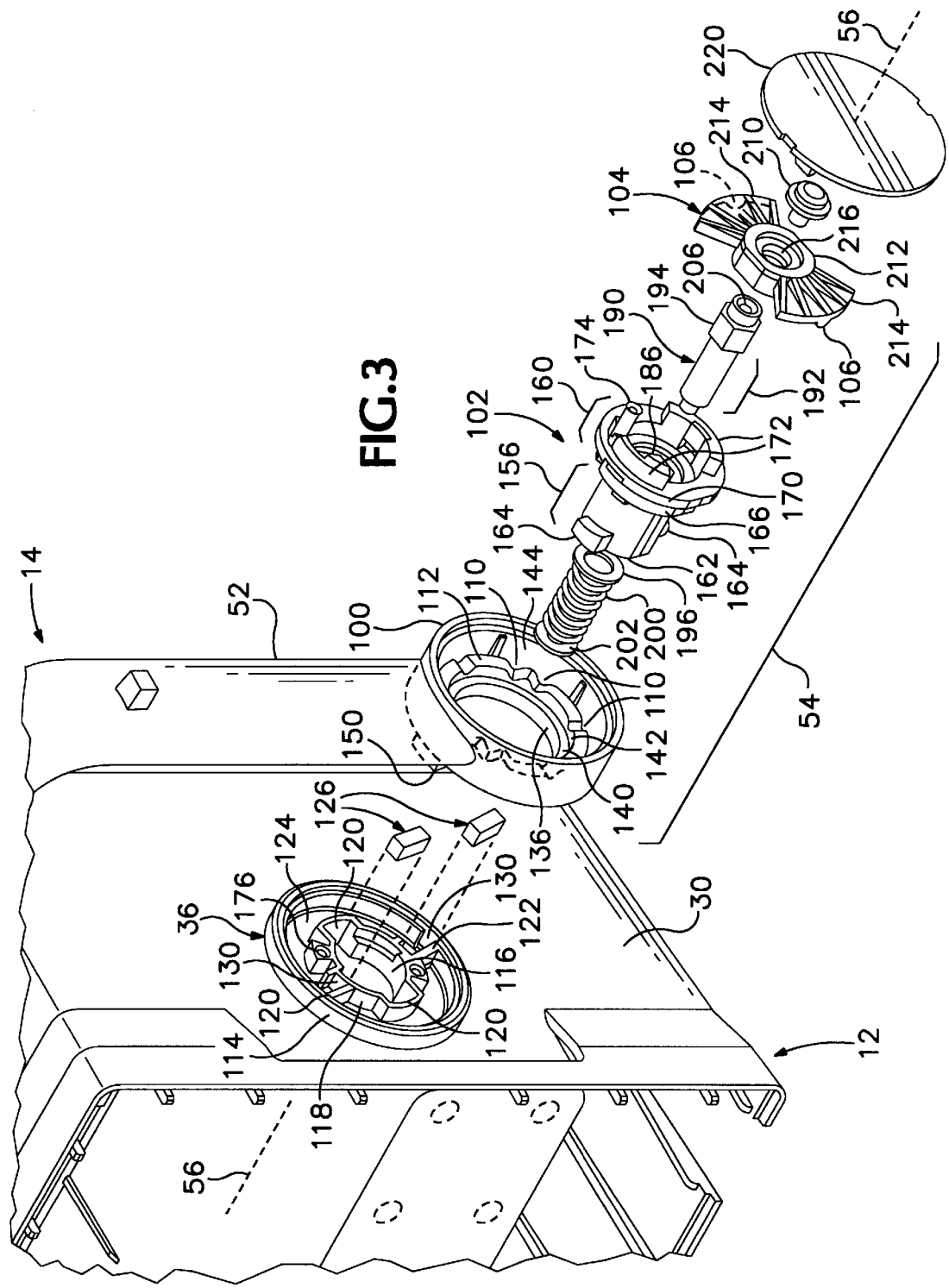
FIG. 3 is an exploded view of the instrument of FIG. 1.

FIG. 3 shows an exploded view of the pivot mechanism. In general, the handle arm 52 terminates at a cylindrical end 100, which is concentrically received within the housing boss 36. A hub 102 passes through the handle end 100, providing an axle for the handle to pivot about, and is secured to the housing. A cam follower 104 is rotationally engaged to the hub and is axially movable against a spring bias toward the housing. The follower has protruding lobes 106 on the surface facing the housing, and which engage grooves 110 in an annular surface 112 in the handle end. Thus, when the handle is pivoted to a position in which the follower lobe 106 aligns with a groove 110 in the cam surface on the handle, the lobe is spring biased into the groove, and the handle is stably established into one of the detented positions determined by the locations of the grooves. When substantial torque is applied to the handle, the follower lobes are ramped out of the grooves against the spring biasing force, and onto the flat annular surface 112, over which the lobes slide readily, presenting little resistance until the next groove and selected stable position is reached.

Figure 4:
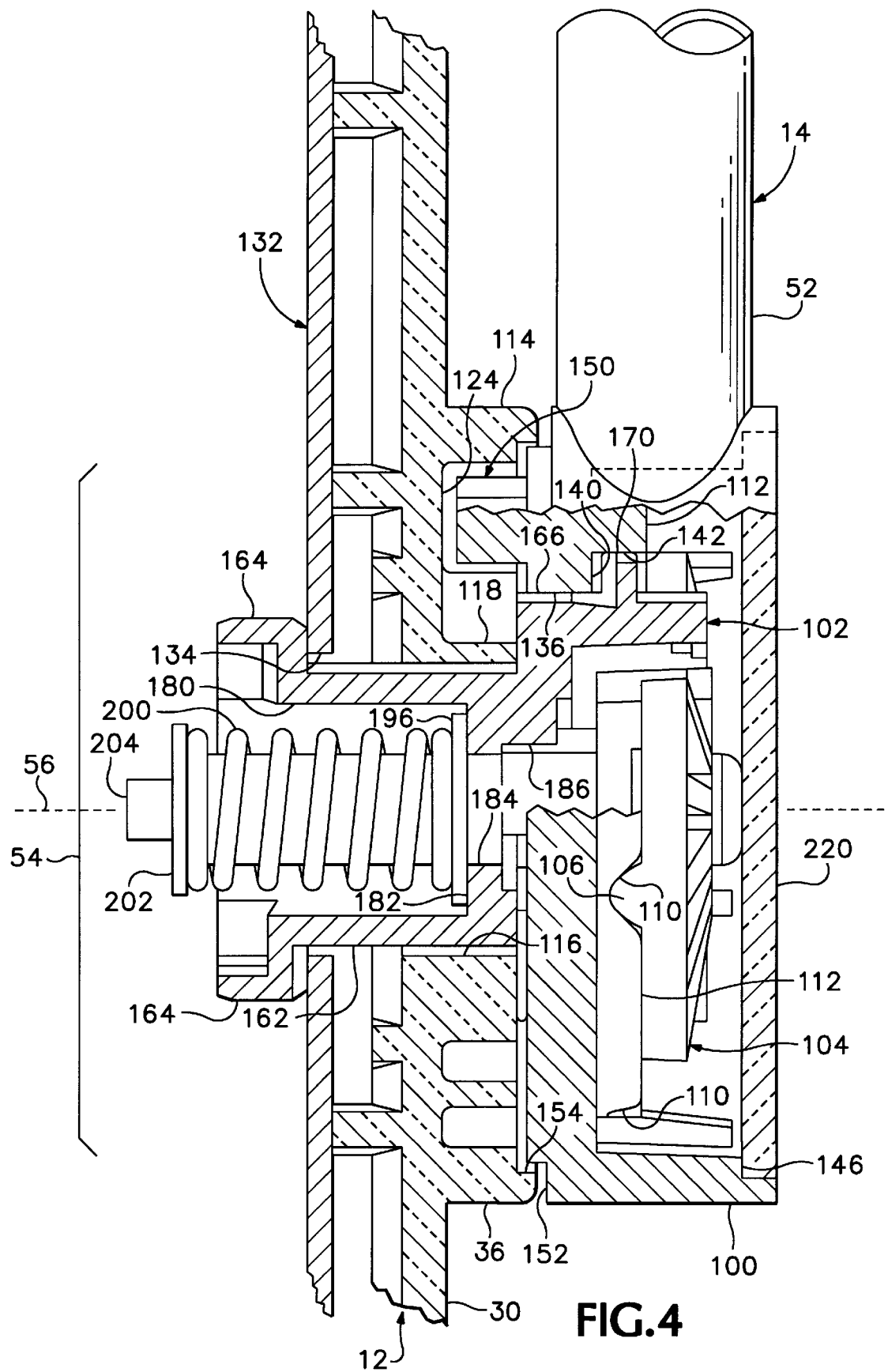
FIG. 4 is an sectional view of the instrument of FIG. 1 taken through the handle axis.

The housing boss 36 is a raised cylindrical collar 114 concentrically surrounding a central aperture 116. The aperture is defined by a raised cylindrical wall 118 having a primarily circular cross section, with opposed keyways 120 extending radially away from the axis 56. A pair of stop walls 122 perpendicular to the housing end panel 30 each extend from the inner wall 118 to the outer collar wall 114. Thus, they define the ends of a C-shaped trackway 124 just inside the outer wall. A pair of rubber pads 126 are positioned in pockets 130 at each end of the trackway, to serve as shock absorbers as will be discussed below. As shown in FIG. 4, an inner housing reinforcing plate 132 is positioned parallel to the housing end wall 30 within the housing, and defines an aperture 134 registered with and having the same profile as the central aperture 116.

Returning to FIG. 3, the handle end 100 has the shape of a cylindrical ring centered on the pivot axis 56. The exterior surface of the ring is a smooth cylindrical surface, with the handle arm 52 extending radially away. The interior of the handle end is a series of stepped cylindrical surfaces. Closest to the housing, a first section 136 defines the smallest bore diameter of the handle end, and provides a shoulder 140 facing away from the housing. A second section 142 has a larger diameter that the first section, and its shoulder is the annular cam surface 112. A third section 144 is spaced radially beyond the outer edge of the cam surface 112, defining a circumferential groove. The outer portion has a small step 146 near the rim facing away from the housing.

A stop tongue 150 extends axially toward the housing from the handle end near the arm 52. The tongue is registered with the trackway 124 of the housing boss to limit the pivotal range of motion of the handle as the tongue strikes the rubber pads 126. This absorbs the energy of even a forceful movement of the handle to its limits, avoiding breakage, deformation, and wear, and providing a quality feel to the user. As shown in FIG. 4, at the surface facing the housing, the handle end portion 100 has a small circumferential step 152 that allows a short reduced diameter portion to be received within a step 154 at interior of the end of the boss wall 114.

Returning to FIG. 3, the cam surface 112 of the handle defines an even number of grooves. Each groove has a diametrically opposed counterpart, and the number and positions of the groove pairs corresponds to the number and relative positions of the desired stable handle positions. Each groove has a profile having convexly curved approaches, straight sloped walls, and a concavely curved bottom.

The hub 102 has an elongated cylindrical portion 156, and a flange portion 160. The cylindrical portion has a nose end 162 having laterally protruding ears 164. The cylindrical portion and ears are sized to closely fit through the aperture 120, 122 in the housing, so that the hub may be rotated about one-quarter turn clockwise to be locked to the housing in the manner of a bayonet mount. The ears have sloped surfaces facing the flange to facilitate the counterclockwise rotation. The length of the cylindrical portion 156 between the flange and the ears is equal to the distance between the panel 132 and the rim of the aperture wall 118. The flange portion of the hub has a first flange portion 166 adjacent the cylindrical portion 156 and having a diameter corresponding to that of the bore section 136 of the handle end. A second flange portion 170 has a larger diameter, corresponding to the second handle bore section 142. As shown in FIG. 4, the second flange captures the first section 136 of the handle against the housing, with an adequately loose fit to permit pivoting.

Returning to FIG. 3, a pair of raised curved walls 172 protrude from the end of the flange portion opposite the cylindrical portion, with gaps defined between the walls. A fastener aperture 174 passes axially through one of the walls, and through the flange portion so that a fastener passing through the hole may engage a hole 176 on the housing hub to secure the hub to the housing against rotation. The fastener may be a rivet, screw, press fit pin, or other suitable device. As shown in FIG. 4, the hub defines an axial bore having a first portion 180 extending into the cylindrical portion 156 and terminating at a floor 182 through which is defined an aperture 184 having a smaller diameter than the first portion 180. The bore continues with a larger hexagonal portion 186 that extends through the flange end 160.

A shaft 190 has a cylindrical portion 192 sized to closely fit through the hub aperture 184 and a hexagonal portion 194 sized to closely fit the hexagonal portion of the bore 186, so that the shaft may reciprocate axially while being constrained against rotation relative to the hub. A washer 196 and compression spring 200 are placed over the shaft within the bore section 180, against the floor of the bore. The spring is compressed, and a lock washer 202 is installed on a post 204 extending from the end of the shaft. The opposite end of the shaft defines a threaded bore 206 for receiving a screw 210.

The cam follower 104 has a central body 212 and a pair of opposed wings 214 extending laterally in a plane perpendicular to the axis 56. The lobes 106 are radially-extending semicylindrical protrusions and are diametrically opposed to each other, so that they simultaneously engage any pair of cam surface grooves on the handle, as noted above. The radius of the lobes is greater than that of the valley of the grooves, so that a precise contact position is defined by two lines of contact, one on each straight wall of each groove. As the cylindrical lobes wear over time, the lines of contact will become planes of contact, and will prevent the detented positions from loosening.

The wings 214 have a width to be closely received in the spaces between the walls 172 of the hub flange, preventing the follower from rotating relative to the hub or housing. With the screw 210 passing through a hole 216 in the follower and secured to bore 206 of the shaft, the follower is spring biased against the handle cam surface 112. The follower is permitted axial displacement away from the housing against the force of the spring, with the displacement limited to a range allowing the lobes to drop into the valleys and ride over the flat cam surfaces, and while the wings are constrained between the walls 172 to prevent rotation at any axial displacement.

A flat lid 220 encloses a chamber defined by the handle end, and rests closely within the step 146 of the handle end rim.

In the preferred embodiment, all parts are formed of rigid thermoplastic material, with the exception of the metal housing plate 132, washers 196 and 202, spring 200, fastener 210, and as otherwise noted. The spring movement of the cam follower allows it to compensate for wear, and to tolerate normal component size variations. With the compression spring extending largely within the housing chamber, the detent mechanism protrudes only a limited distance from the end of the housing, and a slim handle is permitted. With the detent contact being in a line of tangency instead of a point, a longer life is provided. While the disclosure is made in terms of a preferred embodiment, the invention is not intended to be so limited.

What is claimed is:

1. An electronic instrument comprising:
    an instrument housing having opposed end surfaces spaced apart to define a width of the instrument;
    said housing having a handle mount positioned on each end surface;
    a bail handle connected to end surfaces of the housing at said handle mount;
    the handle being pivotally movable between at least a first stable position and a second stable position about a pivot axis passing through the handle mounts;
    the handle having an intermediate portion extending the width of the instrument, and having a terminal arm portion at each end of said intermediate portion, each terminal arm portion having a free end connected to a respective one of the handle mounts; and
    each handle mount and associated terminal arm free end comprising a detent mechanism including:
        a first portion connected to the housing, a second portion connected to the handle, and a spring;
        the detent mechanism being operable to resist pivotal displacement of the handle from a selected one of the first position and the second position in response to a force less than a selected threshold, to allow pivotal displacement of the handle from a selected one of the first position and the second position in response to a force greater than a selected threshold, and to allow pivoting of the handle in response to a limited force less than the selected threshold when in an intermediate position between the first position and the second position;
        wherein said first portion and said second portion includes contoured surfaces which mate when said handle is in either one of said first position and said second position, said mating of said contoured surfaces providing said resistance to said pivotal movement, said resistance being overcome by said application of said force greater than said selected threshold;
        wherein said second portion is aligned with said pivot axis, and includes a pair of follower contours diametrically opposed from each other on opposite sides of said pivot axis;
        wherein said second portion is movable with respect to said housing in a direction parallel to said pivot axis, and said second portion is biased toward said first portion along said pivot axis by said spring.

2. The instrument of claim 1 wherein the handle includes a cam surface having a major portion parallel to a plane perpendicular to the pivot axis, and having a plurality of contoured portions departing from the plane.

3. The instrument of claim 2 wherein the contoured portions are arranged in opposed pairs.

4. The instrument of claim 2 wherein the cam surface is an annulus centered on the pivot axis.

5. The instrument of claim 1 wherein the second portion is rotationally linked to the housing, such that it does not rotate on the pivot axis.

6. An electronic instrument comprising:
    an instrument housing having opposed end surfaces each including a handle mount;
    a bail handle having an elongated intermediate portion with extending arms connected at opposite ends, the arms having free ends connected to the handle mounts;

the handle being pivotally movable between at least a first stable position and a second stable position about a pivot axis passing through the handle mounts; and a pair of detent mechanisms, each including a first portion connected to the housing, and a second portion connected to the handle;

said detent mechanism being operable to resist pivotal displacement of said handle from a selected one of said first position and said second position in response to a force less than a selected threshold, to allow pivotal displacement of said handle from a selected one of said first position and said second position in response to a force greater than a selected threshold, and to allow pivoting of said handle in response to a limited force less than said selected threshold when in an intermediate position between said first position and said second position;

each of said detent mechanisms including a spring; wherein said spring generates a biasing force parallel to said pivot axis; and wherein said first portion and said second portion each include contoured surfaces which mate when said handle is in either one of said first position and said second position, said mating of said contoured surfaces providing said resistance to said pivotal movement, said resistance being overcome by said application of said force greater than said selected threshold.

7. The instrument of claim 6 wherein the handle includes a cam surface having a major portion parallel to a plane perpendicular to the pivot axis, and having a plurality of contoured portions departing from the plane.

8. The instrument of claim 7 wherein the contoured portions of each detent mechanism are arranged in opposed pairs.

9. The instrument of claim 7 wherein the cam surface is an annulus centered on the pivot axis.

10. The instrument of claim 6 wherein the first portion is movable with respect to the housing in a direction parallel to the pivot axis.

11. The instrument of claim 6 wherein the first portion is aligned with the pivot axis, and includes a pair of detent lobes diametrically opposed from each other on opposite sides of the pivot axis.

12. The instrument of claim 6 wherein the detent mechanisms have similar detent patterns such that both mechanisms operate in concert to maintain the elongated intermediate portion of said bail handle parallel to the pivot axis.

13. The instrument of claim 12 including a grip connected to said elongated intermediate portion of the handle, such that a force applied to the handle to cause rotation about said pivot axis acts equally on both detent mechanisms.

* * * * *